United States Patent
Aiello et al.

Patent Number: 5,635,868
Date of Patent: Jun. 3, 1997

[54] POWER TRANSISTOR CURRENT LIMITER

[75] Inventors: Natale Aiello, Catania; Sergio Palara, Acitrezza; Salvatore Scaccianoce, Riposto, all of Italy

[73] Assignee: Consorzio per la Ricerca sulla Microelettronica nel Mezzogiorno, Catania, Italy

[21] Appl. No.: 289,122

[22] Filed: Aug. 11, 1994

[30] Foreign Application Priority Data

Aug. 18, 1993 [EP] European Pat. Off. ............ 93830354

[51] Int. Cl.$^6$ .................... G05F 1/10; H03K 17/60; H03K 17/687
[52] U.S. Cl. .................. 327/538; 327/108; 327/427; 327/478
[58] Field of Search .................. 327/427, 432–437, 327/478–480, 482, 483, 77, 80, 87, 88, 89, 73, 108, 109, 538, 540–543

[56] References Cited

U.S. PATENT DOCUMENTS

| | | | |
|---|---|---|---|
| 4,023,111 | 5/1977 | Mortensen | 330/28 |
| 4,771,357 | 9/1988 | Lorincz et al. | 361/87 |
| 4,912,373 | 3/1990 | Moreau | 315/209 R |
| 5,199,407 | 4/1993 | Sawazaki et al. | 315/209 T |
| 5,222,011 | 6/1993 | Braun | 361/154 |
| 5,396,117 | 3/1995 | Housen et al. | 327/434 |

FOREIGN PATENT DOCUMENTS

| | | |
|---|---|---|
| 107 137 | 5/1984 | European Pat. Off. . |
| 151 764 | 8/1985 | European Pat. Off. . |
| 107 028 | 8/1985 | European Pat. Off. . |
| 307 325 | 3/1989 | European Pat. Off. . |

OTHER PUBLICATIONS

Patent Abstracts of Japan, vol. 9, No. 248 (E–347)(1971) 4 Oct. 1985 & JP–A–60 096 919 (Yamatake Honeywell K.K.) *abstract*.

*Primary Examiner*—Toan Tran
*Attorney, Agent, or Firm*—Robert Groover; Betty Formby

[57] ABSTRACT

A circuit to limit the maximum current passed from a power transistor (T'p) to a load (ZL) which is connected to an output terminal of the transistor. The circuit includes an error amplifier (1'), a driver circuit (P') for the transistor (T'p), and a current detector for detecting the current (IL) flowing through the load (ZL). The current detector is provided with at least first and second terminals, includes a circuit block (2) having an input terminal connected to the control terminal of (T'p) and an output terminal connected to the current generator internal to the amplifier (1'), one input (B') of the amplifier (1') being connected to the first terminal of (Rs) and the other input (A') connected to the second terminal of (Rs). The introduction of the circuit block lowers the open-loop system gain making it stable and producing a smooth reduction of any rise in the load current (IL).

8 Claims, 5 Drawing Sheets

POWER TRANSISTOR CURRENT LIMITER

CROSS-REFERENCE TO RELATED APPLICATION

This application claims priority from EPC App'n 93830354.2, filed Aug. 18, 1993, which is hereby incorporated by reference.

BACKGROUND AND SUMMARY OF THE INVENTION

This invention relates to a limiter circuit for the maximum current passed from a power transistor to a load connected between one output terminal of the transistor and a first terminal of a voltage supply.

In particular, the invention relates to a limiter circuit for the maximum current passed from a power transistor to a load connected between a first output terminal of the transistor and a first voltage supply pole, of the type which includes (as shown in FIG. 1): a driver stage for said transistor, having an input terminal adapted to receive a control signal and an output terminal connected to the control terminal of said transistor; an error amplifier incorporating a current generator and having two input terminals and an output terminal connected to said driver stage; and a circuit for detecting the current being flowed through said load, having a first terminal connected to a second output terminal of said transistor and a second terminal connected to a second supply pole.

There are many ways of limiting the maximum current through a load connected to an output terminal of a power transistor. The most widely used method provides a feedback network comprising an error amplifier, one input whereof is connected to a reference voltage and the other input to a circuit means of detecting the current flowing through the load, while its output is connected to the control terminal of the transistor. That error amplifier basically performs a comparison between the reference voltage with that applied to the other of its inputs, which voltage increases with the current through the load. When these two voltages tend to become equal to each other, the error amplifier output will limit the current at the transistor control terminal, and accordingly, limit the current at the output terminal connected to the load.

A major problem to be faced with such negative feedback arrangements is one of stability, especially where the load connected to the transistor is an inductive one. In fact, a load of this type introduces undesired poles into the transfer function, so that it becomes difficult to compensate the negatively fed-back transistor for frequency because the transistor is liable to begin to oscillating as soon as the error amplifier cuts in.

The circuit disclosed in European Patent No. 0151764-B, which is hereby incorporated by reference and which corresponds to U.S. Pat. No. 4,574,221, is exemplary of an effective compensation, that is, of a negatively fed-back power transistor which stays stable even as the error amplifier in the feedback network cuts in to limit the load current. In that circuit, the transfer function of the transistor is altered by connecting, in the feedback network, a circuit means which comprises a diode-configured transistor and a transistor. The latter has its base connected to a circuit node whose voltage relative to a reference (ground) potential varies according to the load current, and its emitter is impressed with a resistance connected to one leg of the input stage of the error amplifier, the other input of the latter being held at a constant potential. The diode has one terminal connected to a resistor which "senses" the current flowing through the load, and another terminal connected to said transistor base resistor, and hence, to one of the error amplifier inputs. The load current variations reflect as voltage variations across the diode, which variations are known to be of a logarithmic type, that is quite marginal. Thus, such modest voltage variations are transferred to said error amplifier input not held at a constant potential.

The introduction of said circuit means into the feedback network of the power transistor creates a local reaction whose overall effect is of decreasing the voltage gain of the open-loop system, thereby conferring stability on it. However, the action of the error amplifier in limiting the load current still tends to be jerky, causing the increase in load current to stop suddenly before the load current has settled at a constant value.

The underlying technical problem of this invention is to provide a limiter circuit for the maximum current passed from a power transistor to a load connected to an output terminal thereof, wherein the reduction of any load current rise can occur gradually, without any sharp limiting effect and while maintaining a stable condition for the circuit.

This problem is solved, in accordance with innovative teachings of the present application, by using a limiter circuit for the maximum current passed from a power transistor (T'p) to a load (ZL) connected to an output terminal of the transistor, being of a type which comprises an error amplifier (1'), a driver circuit (P') for said transistor (T'p), and a means of detecting the current (IL) flowing through said load (ZL) provided with at least first and second terminals, comprises a circuit block (2) having an input terminal connected to the control terminal of (T'p) and an output terminal connected to the current generator internal of the amplifier (1'), one input (B') of said amplifier (1') being connected to said first terminal of (Rs) and the other input (A') connected to said second terminal of (Rs). The introduction of said circuit block lowers the open-loop system gain making it stable and producing a smooth reduction of any rise in the load current (IL).

BRIEF DESCRIPTION OF THE DRAWING

The disclosed inventions will be described with reference to the accompanying drawings, which show important sample embodiments of the invention and which are incorporated in the specification hereof by reference, wherein:

FIG. 4-b is a correspondent plotting of the voltage levels relative to ground that appear at the two inputs of the error amplifier depicted in FIG. 3.

DETAILED DESCRIPTION OF THE PREFERRED EMBODIMENTS

Figure 1:
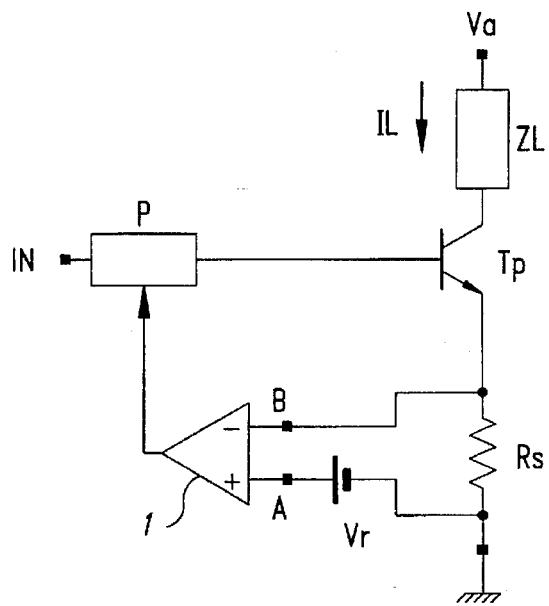
FIG. 1 is a block diagram of a prior art limiter circuit for the current passed to a load via a power transistor.

The numerous innovative teachings of the present application will be described with particular reference to the presently preferred embodiment (by way of example, and not of limitation), in which:

FIG. 1 shows, in block diagram form, an example of a conventional circuit for limiting the current IL passed from a power transistor Tp to a load ZL. As can be seen, the load ZL is connected between a first terminal of a voltage supply Va and an output terminal, the collector, of the transistor Tp; the current IL detecting means comprising a resistor Rs connected to the other output terminal, the emitter, of Tp.

Respectively connected to the two inputs A and B of the error amplifier 1 are a terminal of the resistor Rs and the positive side of a voltage reference Vr. The output of the error amplifier 1 may be connected either directly to the control terminal, i.e. the base, of Tp or, as shown in the drawing figure, to a node of the driver stage P for the transistor Tp. With the current flowing through the base of Tp being negligible, the same current IL as flows through the load ZL will also flow through the resistor Rs; thus, the voltage drop relative to ground that takes place across it will increase with IL. As this voltage tends to exceed the reference voltage Vr, the error amplifier 1 output will limit, through P, the current being supplied to the base of Tp, and hence the collector current IL thereof. Such a negatively fed-back transistor circuit may, as mentioned, become unstable, especially with an inductive type of load connected thereto.

Figure 2:
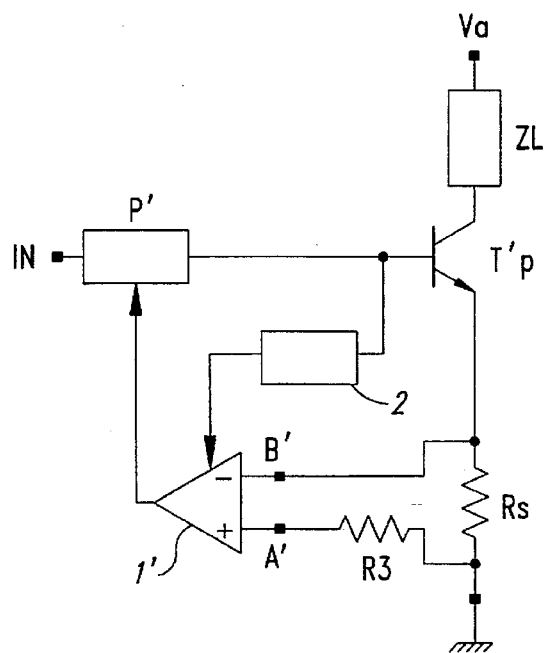
FIG. 2 is a block diagram illustrating this invention.

FIG. 2 is a block diagram of the inventive circuit. Noticeable by comparison with the diagram in FIG. 1 is first of all the provision of a feedback circuit block 2 having an input terminal connected to the control terminal of the power transistor T'p and an output terminal connected to the current generator internal to the error amplifier 1. Just as in FIG. 1, the circuit means for detecting the load current IL is represented by a resistor Rs which is connected between the output terminal of T'p not connected to the load ZL and a terminal of the voltage supply Va, identified as a ground terminal. However, this representation is non-limitative in that such IL detecting means may be implemented in various ways, e.g. as taught in the aforementioned European Patent, that is by a resistor and a resistive divider in parallel which can be accessed via a third, internal detection terminal thereof. In any case, such means would be input a current which can be regarded as virtually coincident with the load current IL, so that the voltage relative to ground will increase with the load current.

Also shown in FIG. 2 is that the error amplifier (1') has one input terminal B' connected to the output terminal of T'p not connected to the load ZL, and has the other input terminal, A', connected to ground via the resistor R3. In this way, the potential relative to ground at the input A' will vary as the current through R3 varies. The output C' of said error amplifier 1' is connected, as in FIG. 1, to a node of the driver circuit P' for the transistor T'p, again in order to properly limit the current flowing through the control terminal of T'p, and hence the load current.

The circuit block 2 constitutes a feedback network within the "main" feedback network formed by Rs and the error amplifier 1' connected to the driver circuit for T'p. That is, it forms a "local" feedback network which is mainly directed to stabilize the system and, therefore, to drive the operation threshold of the error amplifier 1' and provide a smooth limitation of the load current. Notice that, in view of the point of connection of its input terminal, the circuit block 2 will be input a voltage which is the sum of the voltage across the terminals of Rs, which varies with IL, plus the voltage appearing between the control terminal and the output terminal of T'p connected to Rs, which varies with the operational state of T'p. This circuit block is intended to output a current I1 which is a function of said input voltage; this current I1, by flowing to the internal current generator of the error amplifier 1', will regulate the current to be admitted through said resistor R3 and, hence, the potential relative to ground of said input terminal A' of 1'. Thus, by introducing the circuit block 2 with the above characteristics, and by virtue of the peculiar circuit connections specified for the inputs (A' and B') of the error amplifier 1', the potential relative to ground of one (B') of those inputs can be made to vary with the load current and the operational state of the transistor T'p. The cut-in threshold for this error amplifier will, therefore, vary according to such parameters.

One might think of splitting the circuit block 2 into two cascaded circuit blocks, 3 and 4 (not shown in FIG. 2), with a first, 3, effective to lower the open-loop system gain, and the second, 4, effective to deliver, to its output terminal connected to the internal generator of the amplifier 1', a current I1 which is a function of the current I2 flowing between the two terminals of the first circuit block, and hence, of the voltage applied to the input terminal of the latter. The circuit block 3 would comprise basically a resistor, and the circuit block 4 a current (I1) generator driven by the current (I2) which flows through the block 3 and provided, for example, by the output terminal of a bipolar transistor having a resistor connected to another output terminal thereof to which the output terminal of the block 2 is also connected and with a DC voltage generator connected between its control terminal and said resistor.

Of course, nothing forbids the generator (I1) from being regarded as voltage driven.

Figure 3:
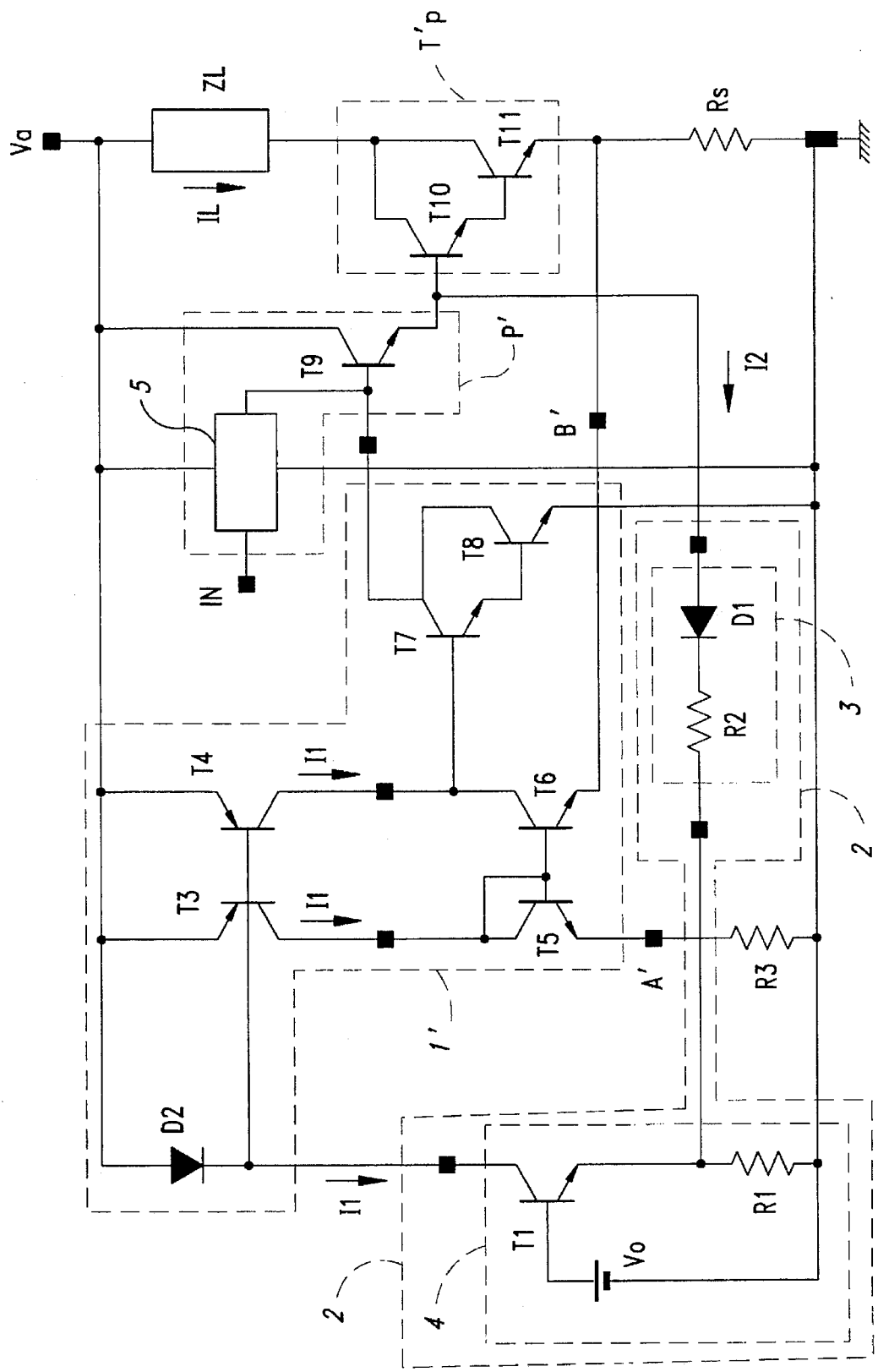
FIG. 3 is a circuit diagram of a preferred embodiment of the invention.

This structure is best shown in FIG. 3, illustrating the circuit diagram of the preferred embodiment of this invention. In that drawing figure, the various circuit blocks shown in FIG. 2 are marked by dashed lines. It can thus be recognized that in this non-limitative embodiment:

the power transistor T'p comprises two transistors T10 and T11 in a Darlington configuration;

the circuit block 3 includes the serial connection of the resistor R2 and the diode D1;

the circuit block 4 comprises the transistor T1, resistor R1, and DC voltage generator Vo;

the driver circuit P' comprises the driver circuit 5, being operated by the control signal IN and connected with its output to the control terminal of transistor T9, which has an output terminal connected to the control terminal of transistor T10, i.e. of T'p; and the error amplifier comprises a differential type of input stage consisting of two transistors T5 and T6, a final stage consisting of the Darlington pair of transistors T7 and T8, and a current mirror circuit consisting of diode D2 and transistors T3 and T4 and representing the internal current generator.

Figure 6:
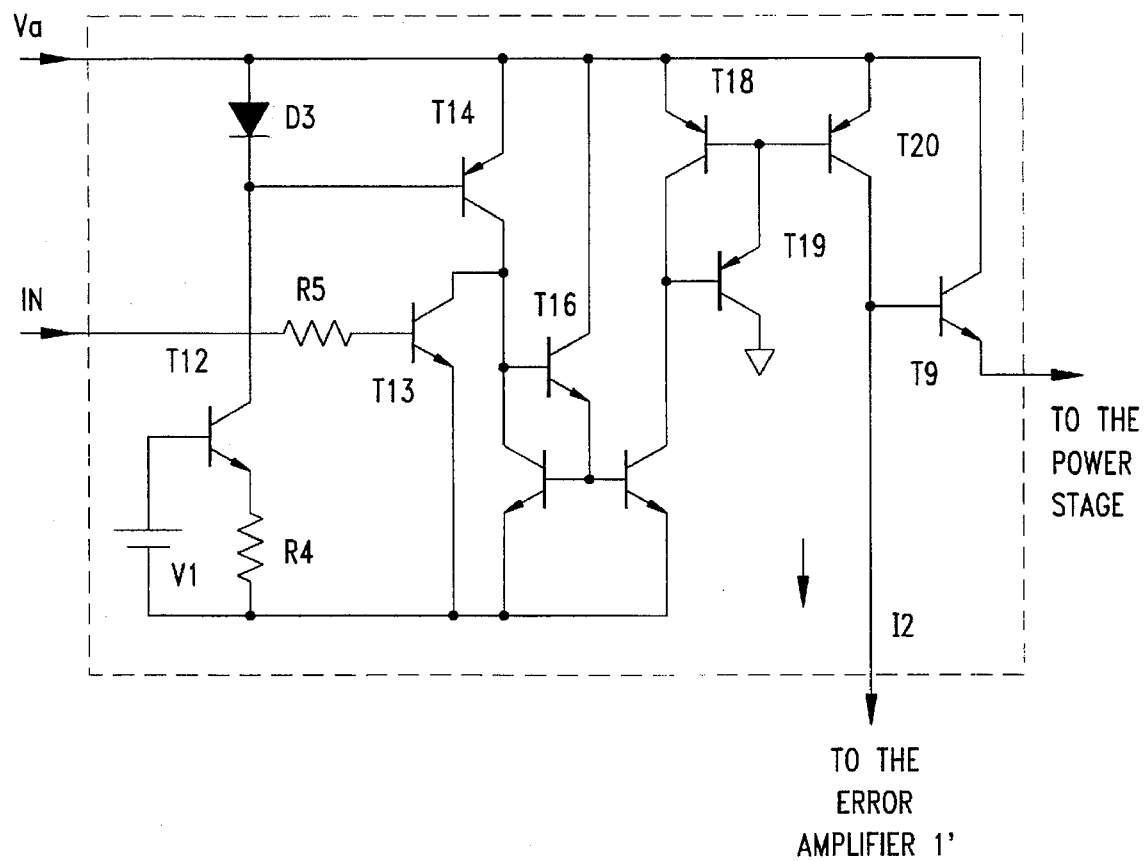
FIG. 6 shows a sample implementation of the driver circuit P', including transistor T9 and driver circuit 5.

FIG. 6 shows a sample implementation of the driver circuit P', including transistor T9 and driver circuit 5. Of course this circuit can be implemented in many other ways, but the specific connections of FIG. 6 give one illustrative implementation.

To explain the action of the circuit block 2 in stabilizing the overall circuit and producing the desired operation of the error amplifier 1', the operation of the whole circuit of FIG. 3 will now be reviewed, with the non-limitative assumption that the load ZL is an inductive one (such as a coil). As previously mentioned, this is the most critical situation in which to evaluate the circuit stability.

At an initial time t=0, the transistor T'p (i.e. the Darlington pair T10, T11) is controlled to conduct from the driver circuit 4 by means of an appropriate input signal IN. Through the collector of T11, that is the load impedance ZL, a current IL will then begin to flow.

The anode of D1 is at a voltage of 2Vbe relative to ground, and the emitter of T1 is set at a voltage V1=Vo−Vbe=0.5 Volts, to be obtained by suitable setting of Vo. A voltage of Vbe−0.5 Volts establishes across R2, as can be readily inferred from the drawing. The value of that voltage divided by the value of R2 gives the value of the current I2 flowing through R2 and D1 to R1, this resistor being connected between ground and the emitter of T1. Thus, the current set at the collector of T1 will be V1/R1 less the current I2 to R2. At all the times t>0, the current IL through the load ZL will cause a voltage drop across the resistor Rs which increases linearly with time, since an inductive load has been assumed. The voltage at the anode of D1 also increases linearly, as does the current I2, which will vary parallel with IL.

However, the current at the collector of T1 has been shown to be I1=V1/R1−I2, and since I2 grows linearly, I1 will decrease in a linear fashion over time. The transistor T1 also impresses its own current I1 on T3 and T4, since D2, T3 and T4 form a current mirror. The current I1 flows through T5 and the resistor R3; accordingly, the voltage VA'=R3×I1 will also decrease linearly over time, thereby tracking the variations of the current I2 and, hence, of the load current IL. The potential at the input B' of the error amplifier 1', in view of the connection to the non-grounded terminal of Rs, is Rs×IL (where, Rs will have an optimum value of 20 milliohms) and, therefore, to the same pattern as IL. On the other hand, VA' and VB' represent the input voltages to the error amplifier 1'; insofar as the voltage at the terminal A' is higher than that at the terminal B', T6 is saturated and holds T7 and T8 in the off state, so that the error amplifier 1' will not be operated; as VB' tends to exceed VA', the input stage of the error amplifier 1' will tend to become unbalanced and cause the transistors T7 and T8 of the final stage to conduct, which transistors, by drawing current from the base of T9, tend to lower the base current of the transistors T10 and T11, i.e. T'p, thereby limiting the current IL through the load ZL. However, at this point, the Vbe of T10 and T11 will also decrease as a result of these transistors being desaturated, and accordingly, the voltage at the anode of D1 will decrease, as consequently will I2. This reflects in I1, and therefore VB', being increased.

Figure 4A:
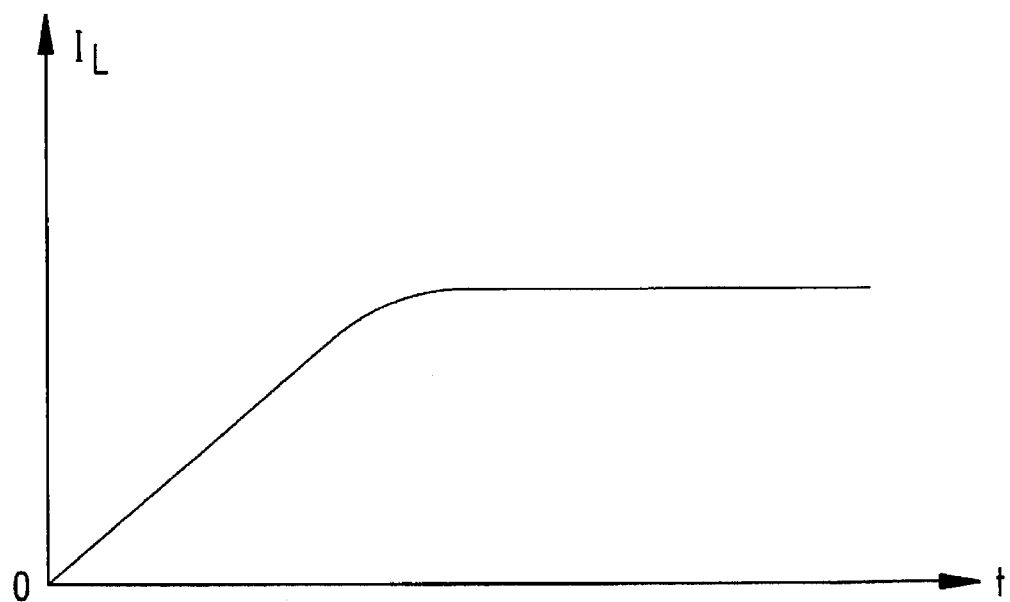
FIG. 4-a is a graph of the current being flowed through the load of the circuit in FIG. 3, when said load is an inductive one.
Figure 4B:
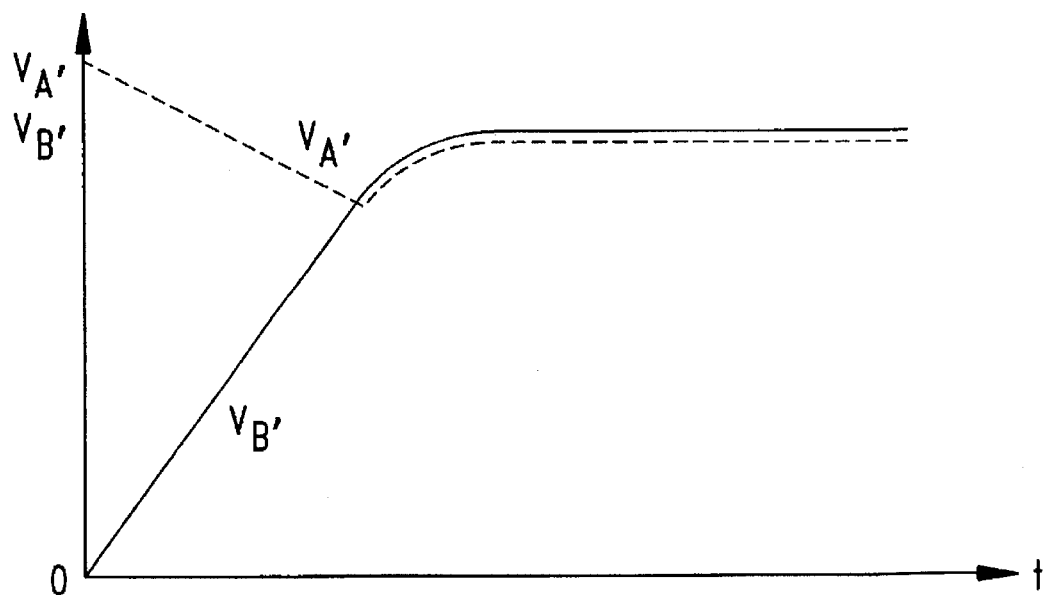

The behavior of the circuit shown in FIG. 3 is summarized by the graphs in FIGS. 4-a and 4-b. Shown in FIG. 4-a is a graph of the variation of the load current IL over time, which variation results from the limiting action applied to its maximum value by the inventive circuit of FIG. 3. As can be seen, the current IL first increases linearly, because VA'>VB' initially. As VB' approaches VA', the potential at the input terminal A', instead of becoming still smaller, begins to increase, as shown in FIG. 4-b, tracking the pattern of VB' which, in turn, reflects that of IL (in view of the linearity of Ohm's law). Specifically, IL increases for a while along the knee-point of the curve in FIG. 4-a, to then become constant at the value Imax which represents the maximum value at which the current to be flowed through the load ZL must be held. The curve of FIG. 4-a clearly reveals what has been stated previously, that is that the inventive circuit of FIG. 3 exerts a smooth action in limiting the current IL to produce a progressive reduction of the latter down to the maximum value sought, without causing any sudden interruptions in its rise, and generating no oscillations.

Figure 5:
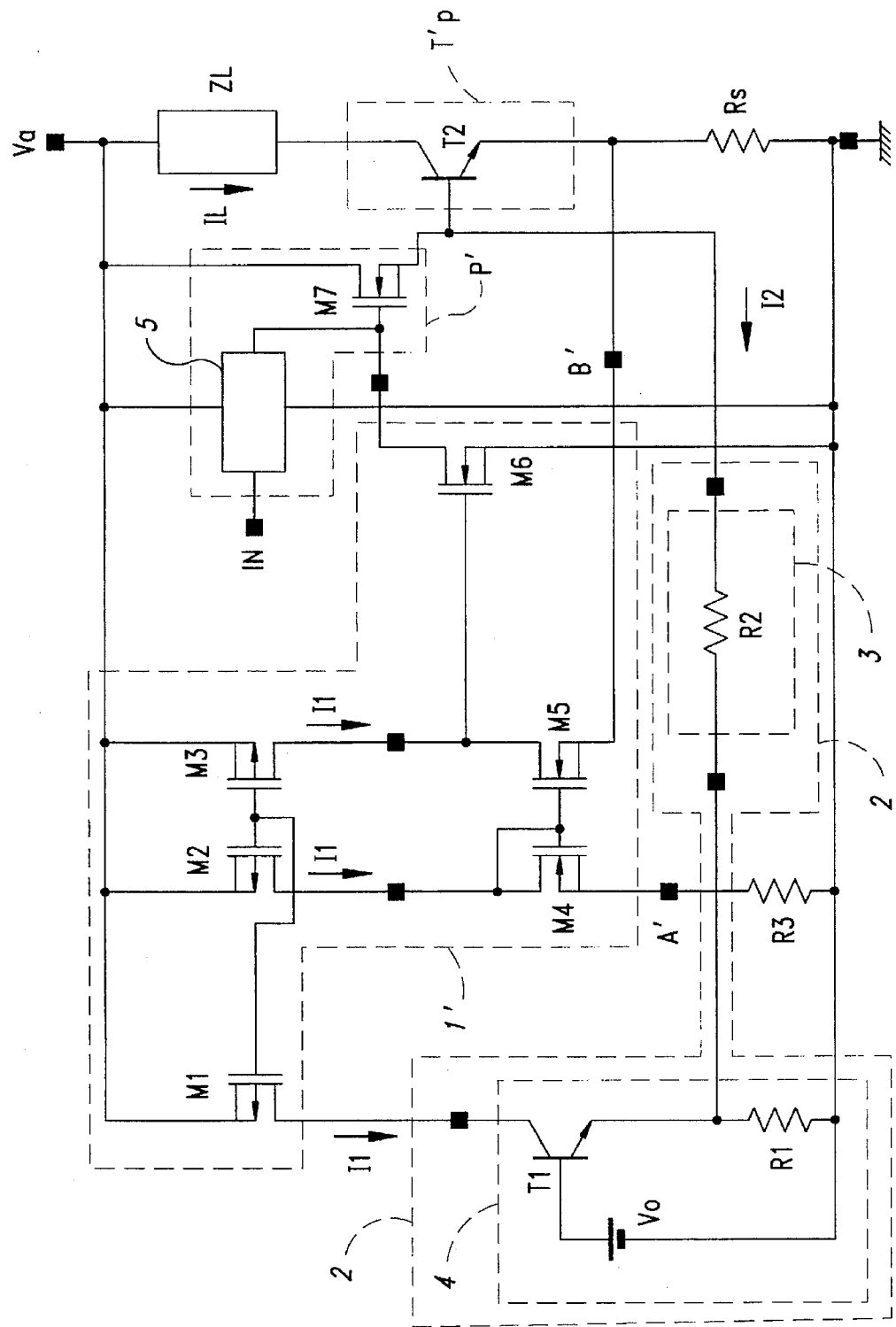
FIG. 5 is a circuit diagram of an embodiment of the invention employing mixed, bipolar and unipolar, component parts.

FIG. 5 illustrates another embodiment of the invention. This embodiment is similar to that shown in FIG. 3, but utilizes a mixed technology with bipolar (BJT) and unipolar (MOSFET) active components, as follows:

the power transistor T'p only consists here of the bipolar transistor T2;

the error amplifier 1' has the same construction as that in FIG. 3, but uses exclusively unipolar active components, the final stage comprising but a transistor M6;

the driver stage P' comprises a driver circuit 5 and unipolar transistor M7, the latter having an output (drain) terminal connected to the control (base) terminal of T2 (i.e., of T'p); and the circuit block 4 is identical with that in FIG. 3 (transistor T1 is again a bipolar type), while the circuit block 3 only comprises the resistor R2.

For another sample modification, it should be noted that the resistors Rs and R3 do not have to be perfectly linear elements, and various load elements could be substituted for the simple resistors shown.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A limiter circuit for the maximum current passed from a power transistor to a load connected between a first output terminal of the transistor and a first supply voltage connection, comprising:

a driver stage for said transistor, having an input terminal adapted to receive a control signal and an output terminal connected to the control terminal of said transistor;

an error amplifier incorporating a current generator and having a first and a second input terminals and an output terminal connected to said driver stage;

a circuit means of detecting the current being flowed through said load, having a first terminal connected to a second output terminal of said transistor and a second terminal connected to a second supply voltage connection; and a feedback circuit block having an input terminal connected to said control terminal of said transistor and an output terminal connected to the current generator internal of said error amplifier, said first input of said error amplifier being connected to said second supply voltage via a resistive element, and said second input of said error amplifier being connected to said first terminal of said detection circuit means;

wherein said feedback circuit block comprises a first circuit block, connected with its input terminal to said control terminal of said transistor and being effective to lower the gain of said transistor, in cascade with a second circuit block, comprising a current-driven current generator, connected with its output terminal to the internal current generator of the error amplifier to deliver a current which is a function of the current delivered by the first circuit block through a common terminal;

wherein said second circuit block comprises a bipolar transistor, a DC voltage generator, and a first resistor, with a first output terminal of said bipolar transistor being connected to said internal current generator of said error amplifier, a second output terminal of said bipolar transistor connected to a first terminal of said first resistor, said DC voltage generator connected between the control terminal of said bipolar transistor and a second terminal of said first resistor, and said first circuit block being further connected to said first terminal of said resistor.

2. A limiter circuit for the maximum current passed from a power transistor to a load connected between a first output terminal of the transistor and a first supply voltage connection, comprising:

a driver stage for said transistor, having an input terminal adapted to receive a control signal and an output terminal connected to the control terminal of said transistor;

an error amplifier incorporating a current generator and having a first and a second input terminals and an output terminal connected to said driver stage;

a circuit means of detecting the current being flowed through said load, having a first terminal connected to a second output terminal of said transistor and a second terminal connected to a second supply voltage connection; and a feedback circuit block having an input terminal connected to said control terminal of said transistor and an output terminal connected to the current generator internal of said error amplifier, said first input of said error amplifier being connected to said second supply voltage via a resistive element, and said second input of said error amplifier being connected to said first terminal of said detection circuit means;

wherein said feedback circuit bock comprises a first circuit block, connected with its input terminal to said control terminal of said transistor and being effective to lower the gain of said transistor, in cascade with a second circuit block, comprising a current-driven current generator, connected with its output terminal to the internal current generator of the error amplifier to deliver a current which is a function of the current delivered by the first circuit block through a common terminal;

wherein said first circuit block comprises a resistor; and wherein said driver stage comprises a driver circuit operated by said control signal and connected to the control terminal of an output transistor having one of its output terminals connected to said control terminal of said power transistor; and said error amplifier comprises a first and a second transistor coupled together at their respective control terminals, a first output terminal of said first transistor being shorted on a point between said control terminals of said first and said second transistors and a first output terminal of said second transistor being connected to the control terminal of an output Darlington, said output Darlington having an output terminal connected to said control terminal of said output transistor, and said first output terminals of said first and said second transistor being also connected to the output terminals of a current-mirror circuit which constitutes said internal current generator of the amplifier and has its input terminal connected to said first output terminal of said second circuit block.

3. A circuit as in claim 1, wherein:

said driver stage comprises a driver circuit operated by said control signal and connected to the control terminal of an output transistor having one of its output terminals connected to said control terminal of said power transistor; and said error amplifier comprises a first and a second transistor coupled together at their respective control terminals, a first output terminal of said first transistor being shorted on a point between said control terminals of said first and said second transistors and a first output terminal of said second transistor being connected to the control terminal of an output Darlington, said output Darlington having an output terminal connected to said control terminal of said output transistor, and said first output terminals of said first said second transistor being also connected to the output terminals of a current-mirror circuit which constitutes said internal current generator of the amplifier and has its input terminal connected to said first output terminal of said bipolar transistor.

4. A circuit as in claim 3, wherein said power transistor consists of two transistors in a Darlington configuration; and said first circuit block further comprises a diode connected serially to a second resistor.

5. A circuit as in claim 3, wherein all the transistors therein are of the bipolar type.

6. A circuit as in claim 4, wherein all the transistors therein are of the bipolar type.

7. A limiter circuit for the maximum current passed from a power transistor to a load connected between a first output terminal of the transistor and a first supply voltage connection, comprising:

a driver stage for said transistor, having an input terminal adapted to receive a control signal and an output terminal connected to the control terminal of said transistor;

an error amplifier incorporating a current generator and having a first and a second input terminals and an output terminal connected to said driver stage;

a circuit means of detecting the current being flowed through said load, having a first terminal connected to a second output terminal of said transistor and a second terminal connected to a second supply voltage connection; and a feedback circuit block having an input terminal connected to said control terminal of said transistor and an output terminal connected to the current generator internal of said error amplifier, said first input of said error amplifier being connected to said second supply voltage via a resistive element, and said second input of said error amplifier being connected to said first terminal of said detection circuit means;

wherein said feedback circuit block comprises a first circuit block, connected with its input terminal to said control terminal of said transistor and being effective to lower the gain of said transistor, in cascade with a second circuit block, comprising a current-driven current generator, connected with its output terminal to the internal current generator of the error amplifier to deliver a current which is a function of the current delivered by the first circuit block through a common terminal;

wherein said first circuit block comprises a resistor;

wherein said power transistor is a transistor of the bipolar type;

said driver stage comprises a driver circuit operated by said control signal and connected to the control terminal of a first unipolar transistor having an output terminal connected to the base of said power transistor; and, said error amplifier comprises second and third unipolar transistors coupled at their respective control terminals, a first output terminal of said second unipolar transistor being shorted on a point between the control terminals of said second and said third unipolar transistors and a first output terminal of said third unipolar transistor being connected to the control terminal of a fourth unipolar transistor which has an output terminal connected to said output terminal of said first unipolar transistor, and said first output terminals of said second and said third unipolar transistors being also connected to the output terminals of a current-mirror circuit made up of unipolar components which constitutes said internal current generator of the amplifier and has its input terminal connected to said first output terminal of said power transistor.

8. A circuit as in claim 1, wherein said power transistor is a transistor of the bipolar type;

said driver stage comprises a driver circuit operated by said control signal and connected to the control terminal of a first unipolar transistor having an output terminal connected to the base of said power transistor; and, said error amplifier comprises second and third unipolar transistors coupled at their respective control terminals, a first output terminal of said second unipolar transistor being shorted on a point between the control terminals of said second and said third unipolar transistors and a first output terminal of said third unipolar transistor being connected to the control terminal of a fourth unipolar transistor which has an output terminal connected to said output terminal of said first unipolar transistor, and said first output terminals of said second and said third unipolar transistors being also connected to the output terminals of a current-mirror circuit made up of unipolar components which constitutes said internal current generator of the amplifier and has its input terminal connected to said first output terminal of said power transistor.

* * * * *